(12) United States Patent
Kapusta et al.

(10) Patent No.: US 7,727,808 B2
(45) Date of Patent: Jun. 1, 2010

(54) ULTRA THIN DIE ELECTRONIC PACKAGE

(75) Inventors: Christopher James Kapusta, Delanson, NY (US); Joseph Alfred Iannotti, Glenville, NY (US); Kevin Matthew Durocher, Waterford, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/138,553

(22) Filed: Jun. 13, 2008

(65) Prior Publication Data

US 2009/0309241 A1  Dec. 17, 2009

(51) Int. Cl.
*H01L 21/00*    (2006.01)

(52) U.S. Cl. ............... 438/109; 438/118; 257/E21.505; 257/E23.01

(58) Field of Classification Search .......... 257/E23.178; 176/E23.178; 361/764; 438/109, 118, 928, 438/E23.01, E21.505, E25.011
See application file for complete search history.

(56) References Cited

U.S. PATENT DOCUMENTS

| | | | |
|---|---|---|---|
| 5,353,498 A * | 10/1994 | Fillion et al. .................. 29/840 |
| 5,703,400 A * | 12/1997 | Wojnarowski et al. ...... 257/723 |
| 6,376,769 B1 | 4/2002 | Chung |
| 6,664,483 B2 | 12/2003 | Chong et al. |
| 6,730,533 B2 | 5/2004 | Durocher et al. |
| 6,767,764 B2 | 7/2004 | Saia et al. |
| 6,994,897 B2 | 2/2006 | Durocher et al. |
| 7,498,205 B2 * | 3/2009 | Jung et al. .................. 438/126 |
| 2004/0063294 A1 | 4/2004 | Durocher et al. |
| 2005/0011856 A1 * | 1/2005 | De Oliveira .................. 216/13 |

(Continued)

FOREIGN PATENT DOCUMENTS

WO    WO9405038    3/1994

(Continued)

OTHER PUBLICATIONS

Sickmiller et al. "Packaging of Ultra-Thin Film GaAs Devices for Increased Thermal Efficiency and High Density MCM's", ELO Technologies, Inc., pp. 1-4 (1999).

(Continued)

*Primary Examiner*—Matthew C Landau
*Assistant Examiner*—Daren Wolverton
(74) *Attorney, Agent, or Firm*—Jason K. Klindtworth

(57) ABSTRACT

A method for forming an ultra thin die electronic package includes disposing a first polymer film on a first substrate, applying a first adhesive layer to the first polymer film, disposing at least one die on the first adhesive layer, disposing a second polymer film on at least one additional substrate, applying a second adhesive layer to the second polymer film on at least one additional substrate, applying a second adhesive layer to the second polymer film, and attaching the first substrate and the at least one additional substrate via the first adhesive layer and the second adhesive layer such that the at least one die is interspersed between. The method also includes forming multiple vias on a top and/or bottom side of the first and the additional substrate(s), wherein the multiple vias are directly connected to the die, and forming an electrical interconnection between the first substrate, the at least one additional substrate and a die pad of the at least one die.

12 Claims, 6 Drawing Sheets

U.S. PATENT DOCUMENTS

2006/0191711 A1* 8/2006 Cho et al. .................. 174/260
2008/0006921 A1 1/2008 Park et al.
2008/0009095 A1 1/2008 Charles, Jr.
2008/0273314 A1* 11/2008 Cho et al. .................. 361/764
2008/0318054 A1* 12/2008 Fillion et al. ................ 428/412

FOREIGN PATENT DOCUMENTS

| | | |
|---|---|---|
| WO | WO2004064464 | 7/2004 |
| WO | WO2004075261 | 9/2004 |
| WO | WO2004109795 | 12/2004 |
| WO | WO2008013673 | 1/2008 |

OTHER PUBLICATIONS

Cazaux et al., "Ultra Thin Electronics for Space Applications" Electronic Components and Tech. Conf., 2001, pp. 1-4.

Takahashi et al., "Ultra-High-Density Interconnection Technology of Three-Dimensional Packaging", Microelectronics Reliability, vol. 43, Issue 8, Aug. 2003, pp. 1-25.

Vandermeulen et al., "High Density Thick Film Substrates for Miniaturized 3D Chip Stacking Packaging Solutions", Genum Corp., Burlington, Canada, pp. 1-7.

Rapala-Virtanen, T., "Processing and Performance of High Density Interconnect (HDI) PWB With Laser Microvia", Adhesive Joining and Coating Technology in Electronics Mfg., 2000 Proceedings 41, 1 page.

* cited by examiner

ULTRA THIN DIE ELECTRONIC PACKAGE

STATEMENT REGARDING FEDERALLY SPONSORED RESEARCH & DEVELOPMENT

This invention was made with Government support under contract number FA9453-04-C-0003. The Government has certain rights in the invention.

BACKGROUND

The present invention relates generally to ultra thin die electronic package and interconnects, and more particularly, to a process for forming electric interconnects to ultra thin components.

Electrical devices have become ubiquitous in society and have assumed many forms. Many of the most commonly encountered devices include portable or notebook computers, cell phones, personnel digital assistants (PDA's), printers, hand held computer games, and the like. Technological advancements have allowed these devices to provide many previously unimagined conveniences. Users have come to expect more and more from these devices, such as being smaller, faster, and more durable.

Electronic packaging is a major discipline within the field of electronic engineering, and includes a wide variety of technologies. It refers to enclosures and protective features built into the product itself and not to shipping containers. It applies both to end products and to components.

Interconnects wherein the die are thinned and attached or connected to rigid PCB boards and wire bonds are formed to make electrical contact are known. The wire bonds must be encapsulated to prevent damage, thus increasing assembly height and overall volume. The rigid PCB limits the wiring to one side of the die and the rigidity of the substrate prevents physical flexibility of the resultant electronic assembly and increases thickness.

As the technology is gradually moving towards reducing the size of the interconnect including the thinness of the die, it is becoming increasingly difficult to handle and connect to these thinned structures.

Therefore, there is a need for a process for forming an ultra thin die electronic package and interconnect.

BRIEF DESCRIPTION

In accordance with an embodiment of the invention, a method for forming an ultra thin die electronic package is provided. The method includes disposing a polymer film on a first substrate. The method also includes applying an adhesive layer to the polymer film. The method further includes disposing at least one die on the adhesive layer. The method also includes repeating above steps on at least one additional substrate. The method further includes attaching the first substrate and the at least one additional substrate with the adhesive layer such that the at least one die is interspersed between. The method also includes forming multiple vias on at least one of a top side, a back side or both sides of the first and the at least one additional substrate to the die. The method further includes forming an electrical interconnection between the first substrate, the at least one additional substrate and a die pad of the at least one die.

In accordance with another embodiment of the invention, an ultra thin die electronic package is provided. The ultra thin die electronic package includes a first substrate and at least one additional substrate coated with a polymer film and an adhesive, the first substrate and the at least one additional substrate comprising metallized vias. The ultra thin die electronic package also includes an ultra thin die comprising a thickness less than about 100 microns embedded between the first substrate and the at least one additional substrate with at least one electrical interconnect.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
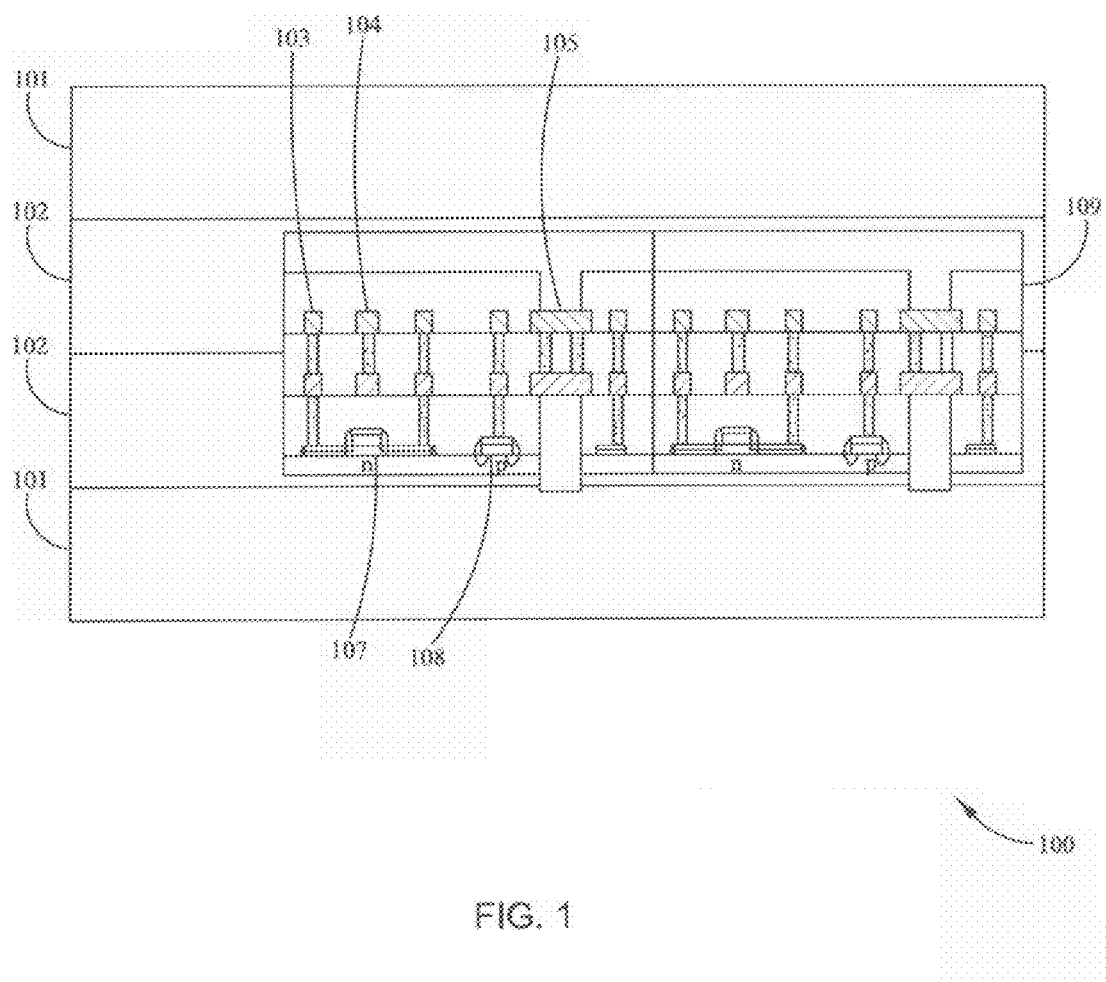
FIG. 1 is a cross-sectional view of an ultra thin die electronic package in an embodiment of the present invention.

In the following description, numerous specific details are given to provide a thorough understanding of the invention. However, it will be apparent that the invention may be practiced without these specific details. In order to avoid obscuring the present invention, some well-known circuits, package configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawings. Similarly, although the sectional views in the drawings for ease of description show the thin die pad, interconnect layers of substrate, this arrangement in the FIGs. is arbitrary. The same suffix numbers are being used in all the drawing FIGs. to relate to the same elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a die electronic package 100 in an embodiment of the present invention. In one embodiment, the die includes a thick die of thickness having a range between about 400 to about 500 microns. In another embodiment, the die is an ultra thin die having a thickness less than about 100 microns. A die 109 is embedded between a first substrate (not shown) and at least one additional substrate (not shown) coated with polymer film or dielectric layers 101 and adhesive layers 102 respectively. Non-limiting examples of the polymer film include a polyimide film such as KAPTON®, liquid crystal polymer, or other polymeric materials. In an exemplary embodiment, a thickness of the polymer film layer 101 is less than about 25 microns and the adhesive layer 102 is less than about 12 microns. Non-limiting examples of the die include silicon dioxide, gallium arsenide, silicon, or silicon germanium, thin film passive components, printable electronics. In the illustrated embodiment, the die 109 includes an n-type layer 107 and a p type layer 108. It will be appreciated that the die is not limited to the aforementioned structures. In another embodiment, the die is an integrated chip (IC). Further, interconnect layers of the die 109 referenced by numerals 103, 104 and 105 are formed during a fabrication process of the die, such as, an IC fabrication process. In a particular embodiment, the thickness of the interconnect layers is at least about 25 microns.

Figure 2:
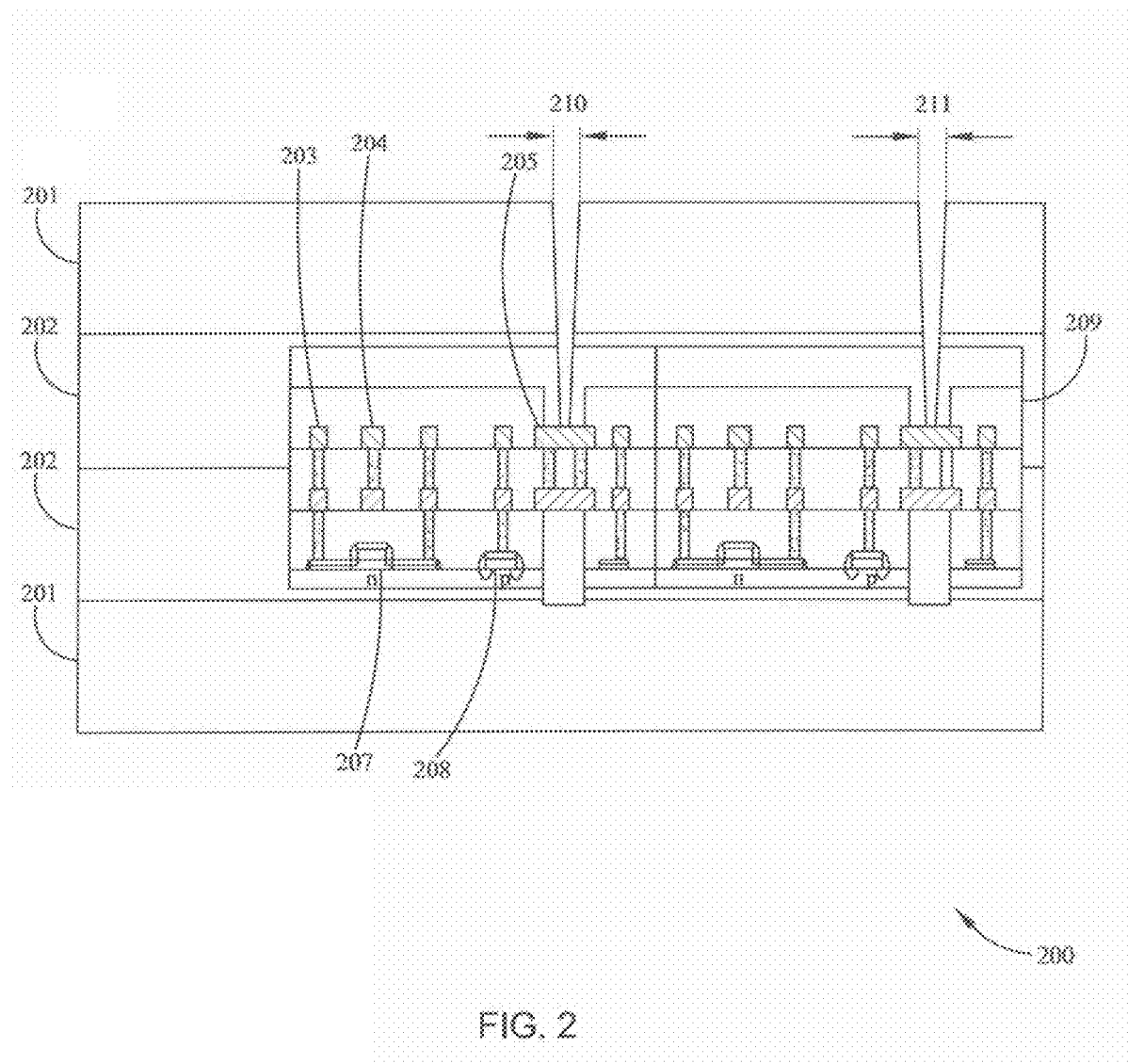
FIG. 2 is a cross-sectional view of drilling of ultra thin die electronic package from the top side.

FIG. 2 is a cross-sectional view of a die electronic package 200 including vias 210 and 211 formed from a top side. The vias 210, 211 are formed by drilling or etching. In one embodiment, the vias are laser drilled. In another embodiment, the vias 210, 211 are formed by laser ablation. Other non-limiting examples include plasma etching and wet etching. A die 209 is embedded between a first substrate (not shown) and at least one additional substrate (not shown) coated with polymer film or dielectric layers 201 and adhesive layers 202 respectively. Non-limiting examples of the polymer film include a polyimide film such as KAPTON®. In an exemplary embodiment, a thickness of the polymer film layer 201 is less than about 25 microns and the adhesive layer 202 is less than about 12 microns. Non-limiting examples of the die include silicon dioxide, gallium arsenide, silicon, or silicon germanium. In the illustrated embodiment, the die 205 includes an n-type layer 207 and a p type layer 208. In another embodiment, the die is an IC. Further, interconnect layers of the die 209 referenced by numerals 203, 204 and 205 are formed during a fabrication process of the die, such as, but not limited to, an IC fabrication process.

Figure 3:
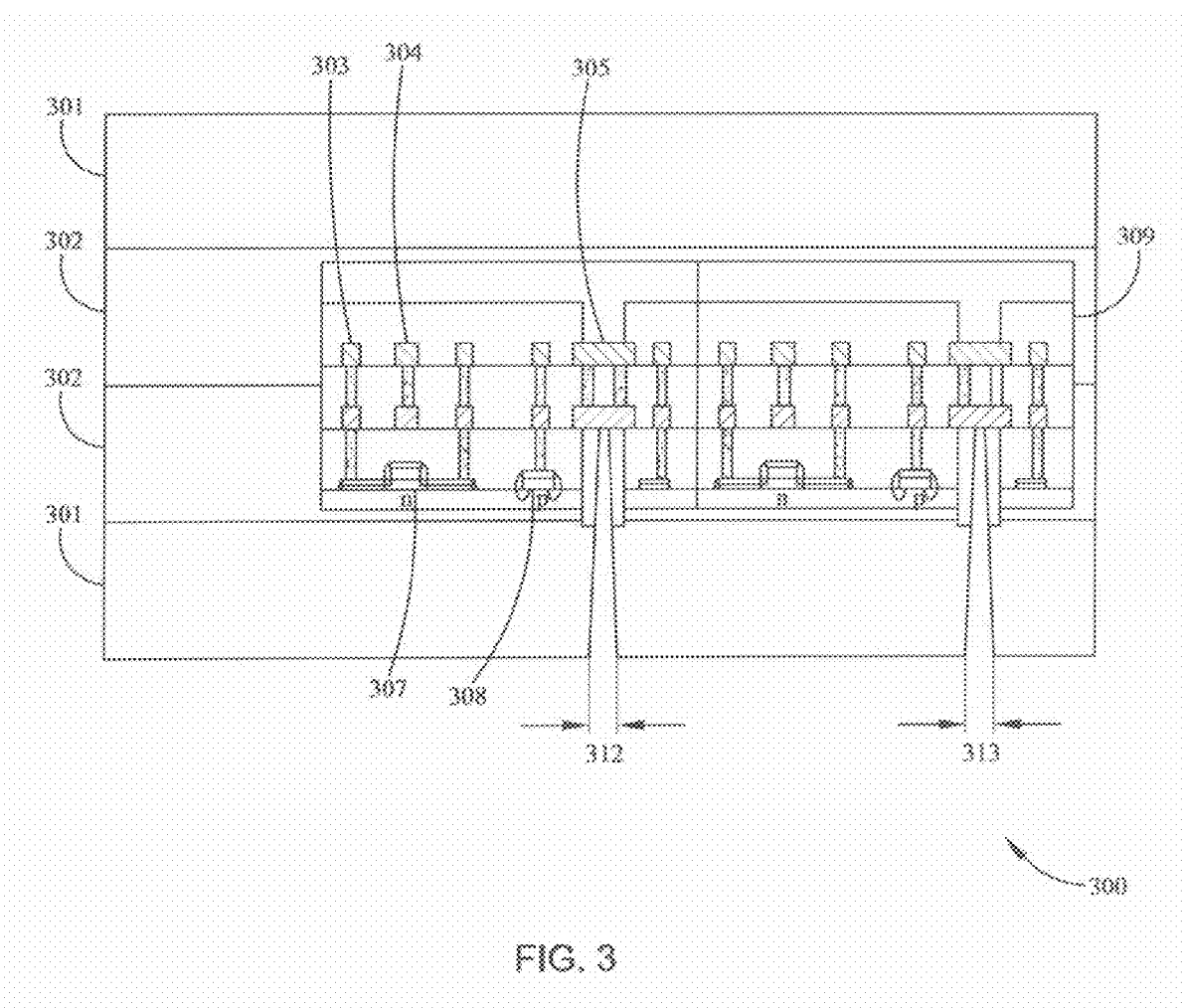
FIG. 3 is a cross-sectional view of drilling of ultra thin die electronic package from a bottom side.

FIG. 3 is a cross-sectional view of a die electronic package 300 including vias 312, 313 formed from a back side in yet another embodiment of the invention. The vias 312, 313 are formed by drilling or etching. In one embodiment, the vias are laser drilled. In another embodiment, the vias 312, 313 are formed by laser ablation. Other non-limiting examples include plasma etching and wet etching. A die 309 is embedded between a first substrate (not shown) and at least one additional substrate (not shown) coated with polymer film or dielectric layers 301 and adhesive layers 302 respectively. Non-limiting examples of the polymer film include a polyimide film such as KAPTON®. In an exemplary embodiment, a thickness of the polymer film layer 301 is less than about 12 microns and the adhesive layer 302 is less than about 12 microns. Non-limiting examples of the die include silicon dioxide, gallium arsenide, silicon, or silicon germanium. In the illustrated embodiment, the die 309 includes an n-type layer 307 and a p type layer 308. In another embodiment, the die is an IC. Further, interconnect layers of the die 309 referenced by numerals 303, 304 and 305 are formed during a fabrication process of the die, such as, but not limited to, an IC fabrication process.

Figure 4:
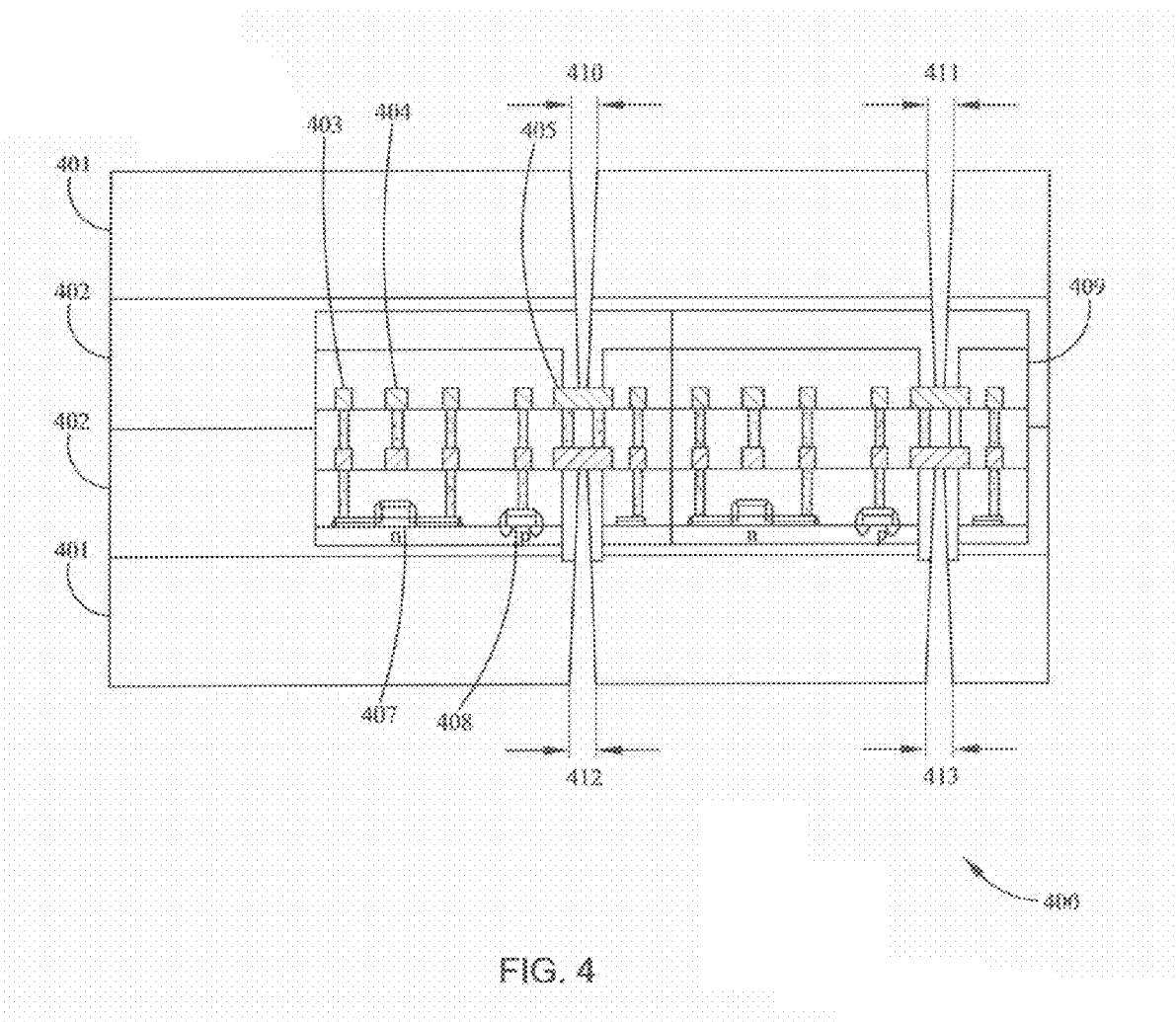
FIG. 4 is a cross-sectional view of drilling of ultra thin die electronic package from both the sides.

Referring to FIG. 4, therein is shown a cross-sectional view of a die electronic package 400 including vias formed from both the sides as shown by 410, 411, 412 and 413 in accordance with an embodiment of the present invention. The vias 410, 411, 412, 413 are formed by drilling or etching. The vias formed on both sides allow direct laser via interconnect to a fine pitch component. In one embodiment, the vias are laser drilled. In another embodiment, the vias 410, 411, 412, and 413 are formed by laser ablation. Other non-limiting examples include plasma etching and wet etching. A die 409 is embedded between a first substrate and at least one additional substrate coated with polymer film or dielectric layers 401 and adhesive layers 402 respectively. Non-limiting examples of the polymer film include a polyimide film such as KAPTON®. In an exemplary embodiment, a thickness of the polymer film layer 401 is less than about 12 microns and the adhesive layer 402 is less than about 12 microns. Non-limiting examples of the die include silicon dioxide, gallium arsenide, silicon, or silicon germanium. In the illustrated embodiment, the die 409 includes an n-type layer 407 and a p type layer 408. In another embodiment, the die is an IC. Further, interconnect layers of the die 409 referenced by numerals 403, 404 and 405 are formed on a die pad during a fabrication process of the die, such as, but not limited to, an IC fabrication process.

Figure 5:
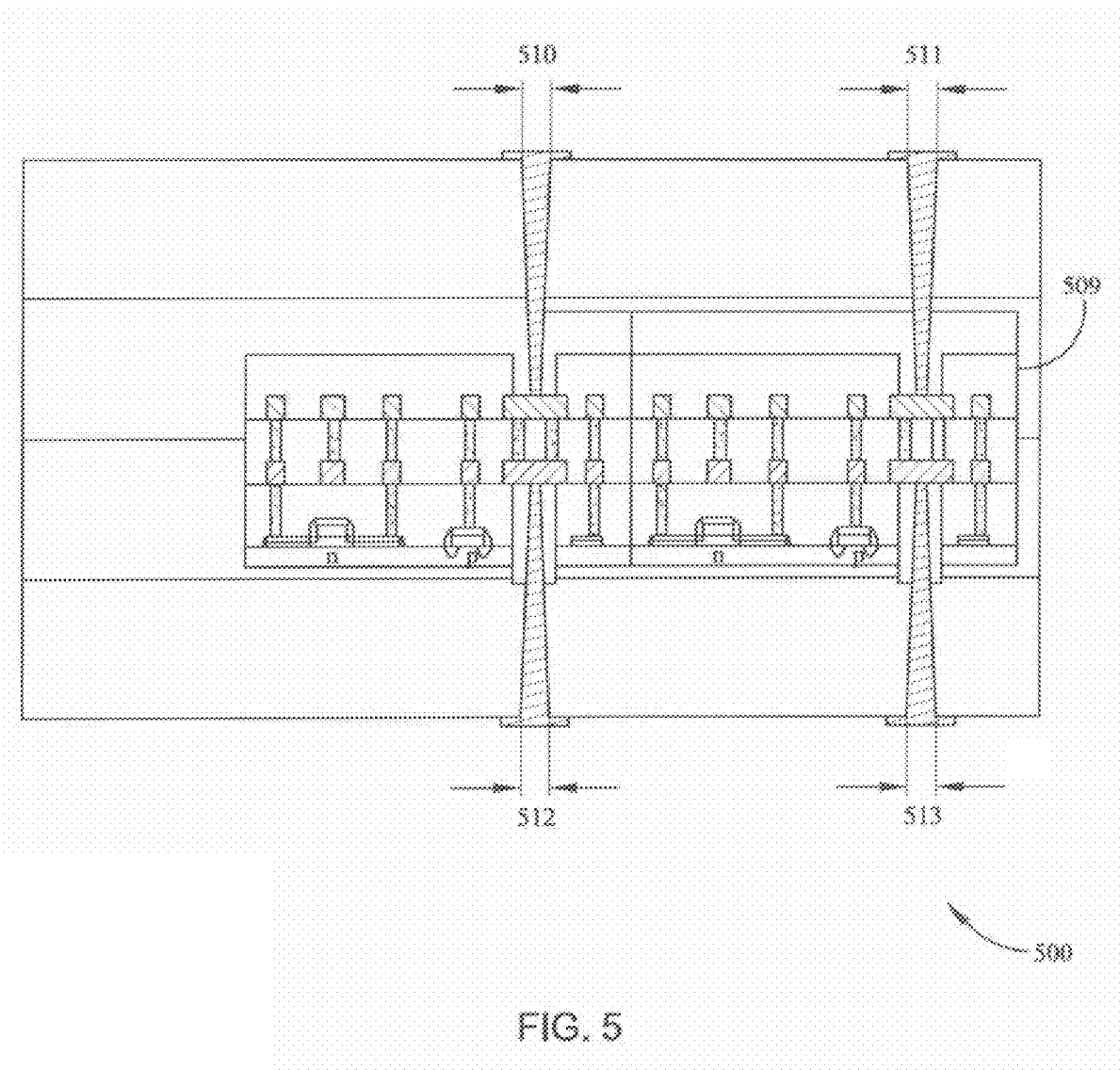
FIG. 5 is a cross-sectional view of the metalized part of the interconnect to die of ultra thin die electronic package.

FIG. 5 is a cross-sectional view of a die electronic package 500 including metalized vias 510, 511, 512 and 513, according to an embodiment of the present invention. The vias 510, 511, 512, and 513 are formed by drilling or etching. In one embodiment, the vias are laser drilled. In another embodiment, the vias 510, 511, 512, and 513 are formed by laser ablation. Other non-limiting examples include plasma etching and wet etching. The vias 410, 411, 412, and 413 in FIG. 4 are metallized to form the metallized vias 510, 511, 512 and 513 from interconnect to die pad of a die 509. In one embodiment, electrical lines or traces may be fanned out for easier access and for other routing/interconnect as well as surface mount components and contact pads.

Figure 6:
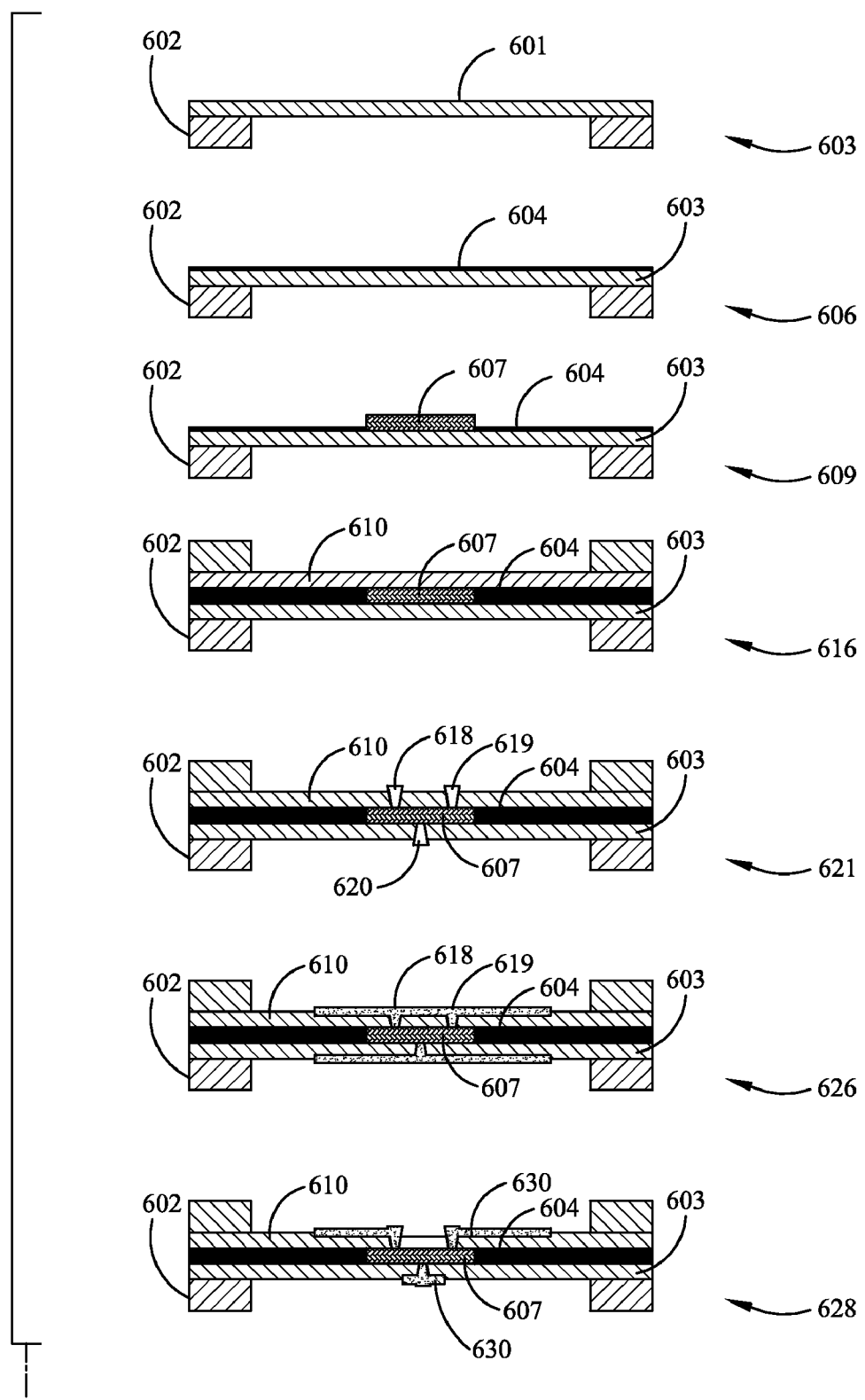
FIG. 6 shows the process flow chart of adhesive and assembly of ultra thin die electronic package in accordance with an embodiment of the invention.

FIG. 6 is a flow chart illustrating steps in a method for forming a die electronic package in accordance with one of the embodiment of the present invention. A polymer film or dielectric layer 601 is disposed on to a first substrate 602 in step 603. In one embodiment, embedded passive components such as, but not limited to, capacitors, resistors, and antenna structures may be disposed on the dielectric layer. An adhesive layer 604 is applied to the said polymer film layer 601 in step 606. In one embodiment, the adhesive is spin coated or spray coated. In another embodiment, a dry film adhesive is applied. At least one die 607 is disposed onto the adhesive 604 in step 609. In a particular embodiment, the polymer film layer 601 is metal coated prior to applying adhesive, to provide an additional layer of metallization for ground plane or registration marks or forming a capacitive layer. Further, steps 603, 606, and 609 are repeated for at least one additional substrate 610. The additional substrate 610 is glued on to the first substrate 602 in step 616 such that the die 607 is embedded within the adhesive and the polymer film layers. In a particular embodiment, unit formed in step 616 is run through a vacuum laminator to eliminate voids. In another embodiment, the adhesive 604 is cured in a heated laminator press such as, but not limited to, a carver press. Vias 618, 619 and 620 are formed on at least one of a top side, a backside or both sides of the first and the at least one additional substrate to the die 607 in step 621. In a particular embodiment, the vias are formed by drilling or etching. In one embodiment, the vias are laser drilled. In another embodiment, the vias are formed by laser ablation. Other non-limiting examples include plasma etching and wet etching. In yet another embodiment, the vias are formed to the metal layers on the polyimide and/or to the embedded passive layers.

Further, an electrical interconnection 630 is formed between the first substrate 602, the additional substrate 610 and a die pad of the at least one die 607. The vias are metallized in step 626, and resist coated, pattern etched in step 628 to form the electrical interconnection 630. Finally, the above steps may be repeated for additional layers to form a flexible multi-layer assembly and also multiple die can be added to form a multi-chip assembly. In a particular embodiment, an additional set of components may be stacked on the above laminated die electronic package in a three dimensional (3D) direction to form a 3D stack. In yet another embodiment, connection pads may be formed on top of the dielectric layer 601 to enable connection of the die electronic package to other electronic circuit boards and like. Furthermore, in one embodiment, a rigid carrier or a temporary carrier such as, but not limited to, a handle, may be used to hold the package during the process. In another exemplary embodiment, the die 607 may be disposed at different locations within the multi-layer assembly.

The embodiment of the present invention offers several advantages. Firstly, the invention provides a very thin electronic package that is extremely useful in micro electronics, sensors and wearable electronics. Further, the particular invention because of its extremely light weight, small size and flexible form factor, will be extremely useful in the embedded electronics market.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within scope of the invention as determined by the appended claims when interpreted in accordance with the breadth to which they are fairly, legally, and equitably entitled.

While only certain features of the invention have been illustrated and described herein, the embodiments described are exemplary and non-limiting as many modifications and changes will occur to those skilled in the art. It is, therefore, to be understood that the appended claims are intended to cover all such modifications and changes as fall within the true spirit of the invention.

The invention claimed is:

1. A method of forming a die electronic package comprising:
    disposing a first polymer film on a first substrate;
    applying a first adhesive layer to the first polymer film on the first substrate;
    disposing at least one die on the first adhesive layer on the first substrate;
    disposing a second polymer film on at least one additional substrate;
    applying a second adhesive layer to the second polymer film on the at least one additional substrate;
    attaching the first substrate and the at least one additional substrate with the first adhesive layer and the second adhesive layer such that the at least one die is interspersed between;
    forming a plurality of vias on a top side and a bottom side of each of the first and the at least one additional substrate, wherein the plurality of vias are directly connected to the die; and
    forming an electrical interconnection between the first substrate, the at least one additional substrate and a die pad of the at least one die.

2. The method of claim 1, wherein said applying comprises applying the first adhesive layer and the second adhesive layer via spin coating or spray coating.

3. The method of claim 1, wherein said applying comprises applying a dry film adhesive layer.

4. The method of claim 1, wherein the first polymer film and the second polymer film comprise a polyimide film.

5. The method of claim 1, wherein the die comprises a thickness less than about 100 microns.

6. The method of claim 1, wherein the first adhesive layer and the second adhesive layer comprise a thickness less than about 12 microns.

7. The method of claim 1, wherein said attaching comprises removing voids in the first substrate and at least one additional substrate using a vacuum laminator and subsequently curing the first adhesive layer and the second adhesive layer.

8. The method of claim 1, wherein said forming the plurality of vias comprises drilling the vias or etching.

9. The method of claim 8, wherein the drilling comprises laser drilling or laser ablation.

10. The method of claim 8, wherein the etching comprises plasma etching or wet etching.

11. The method of claim 1, wherein the die comprises silicon dioxide, gallium arsenide, silicon, or silicon germanium.

12. The method of claim 1, wherein the first adhesive layer and the second adhesive layer comprise at least one of a spin on adhesive, or a dry film adhesive, or combinations thereof.

* * * * *